(12) United States Patent
Hudson et al.

(10) Patent No.: US 6,535,831 B1
(45) Date of Patent: Mar. 18, 2003

(54) METHOD FOR SOURCING THREE LEVEL DATA FROM A TWO LEVEL TESTER PIN FASTER THAN THE MAXIMUM RATE OF A TESTER

(75) Inventors: Brewster T. Hudson, Downingtown, PA (US); Benjamin Jaszczyszyn, Downingtown, PA (US)

(73) Assignee: 3Com Corporation, Santa Clara, CA (US)

( * ) Notice: Subject to any disclaimer, the term of this patent is extended or adjusted under 35 U.S.C. 154(b) by 340 days.

(21) Appl. No.: 09/616,867

(22) Filed: Jul. 14, 2000

(51) Int. Cl.$^7$ ................................................. G06F 19/00
(52) U.S. Cl. ..................... 702/124; 324/763; 714/724
(58) Field of Search ........................ 702/58, 59, 64, 702/65, 108, 117, 118, 120, 122, 124, 126, 183, 177, 185, 188, 189, 125, FOR 103, FOR 104, FOR 106, FOR 134, FOR 154, FOR 170, FOR 171; 714/39, 43, 50, 51, 709, 715, 719, 724, 740, 742; 324/535, 750, 755, 759, 763

(56) References Cited

U.S. PATENT DOCUMENTS

| 4,315,330 A | * | 2/1982 | Brickman et al. | 370/241 |
| 4,712,058 A | * | 12/1987 | Ranson et al. | 324/763 |
| 6,128,754 A | * | 10/2000 | Graeve et al. | 714/39 |
| 6,161,162 A | * | 12/2000 | DeRoo et al. | 710/244 |
| 6,217,213 B1 | * | 4/2001 | Curry et al. | 374/178 |
| 6,252,448 B1 | * | 6/2001 | Schober | 327/259 |
| 6,300,923 B1 | * | 10/2001 | Havel | 345/83 |

OTHER PUBLICATIONS

Toolbox™ User Manual, Part No.: 071–1015–02, Credence Systems Corporation, Jul. 1999, pp. 3–35, 3–36, 5–185 through 5–194, and Application Note #10 (pp. 1–6).

\* cited by examiner

*Primary Examiner*—Marc S. Hoff
*Assistant Examiner*—Mohamed Charioui
(74) *Attorney, Agent, or Firm*—Michaelson & Wallace; Peter L. Michaelson

(57) ABSTRACT

In one embodiment, a method is provided for testing using a programmable tester to generate a driven three state signal having a data rate faster than a maximum selectable rate of test vectors. The test vector has vector characters, each controlling a test state of a pin of a device under test. The method includes selecting a vector rate slower than a desired data rate of the driven three state signal and controlling a tester I/O device during a vector period to provide an output signal having a driven high state, a driven low state, or an inhibited state. The output signal is supplied to an input of a pull-to-center circuit adapted to provide a driven high state, a driven low state, or an output driven to a state intermediate of the driven high and the driven low states when the input of the pull-to-center circuit is supplied with an inhibited state at the input. The three state signal is utilized in testing the device under test.

34 Claims, 3 Drawing Sheets

METHOD FOR SOURCING THREE LEVEL DATA FROM A TWO LEVEL TESTER PIN FASTER THAN THE MAXIMUM RATE OF A TESTER

BACKGROUND

At the physical layer of a communication channel, integrated circuits transmit and receive signals over a transmission line. Transmit circuitry multiplexes several parallel lines of digital data and provides an encoded serial analog signal to the transmission line. Receive circuitry decodes and de-multiplexed the analog signal for further processing. A single integrated circuit device can be used to both transmit and receive signals at each end of a transmission line.

As one measure of performance is its data rate, the data rate of such devices can outpace the capabilities of the test equipment used to verify its functionality. Programmable automated test equipment typically used to perform functional testing, however, is often costly to upgrade or replace. As such, test methods which extend tester utilization are desirable.

FIG. 1 illustrates a possible way to test the functionality of a device having a transmission rate faster than the operating frequency of the tester 100. A 100 MHz tester 100, such as a 100 MHz Credence DUO, supplied by Credence Systems Corp. of Fremont, Calif., is connected to digital lines 25a and 25b of a transmit/receive integrated circuit 200. Signals are provided to the digital lines 25a which operate at a 25 MHz rate. The transmit circuitry within the device uses the data provided from digital lines 25a to produce an MLT3 encoded analog signal at twisted pair transmit terminals 125a.

A jumper 10 is provided between the twisted pair transmit terminals 125a and twisted pair receive terminal 125b of the device 200. The 125 MHz MLT3 signal is processed by receive circuitry and output on the 25 MHz digital receive lines 25b. The digital signals at 25b are tested by the t ester 100 to verify proper functionality of the transmit and receive circuitry of integrated circuit 200.

This loop back testing methodology has the advantage of functionally testing the transmit and receive circuitry of the device 200 without requiring the tester 100 to provide the 125 MHz. This methodology, however, does not allow independent testing of the transmit and the receive circuits. As a result, some capabilities of the device 200 can not be tested. For example, the ability of the phase locked loop portion of the receive circuitry to track at varying frequencies is not tested using the loop back methodology. As such, while loop back testing does provide some indication of the functionality of the device 200, it does not fully test the functionality of the device 200.

SUMMARY

In one embodiment, a method is provided for testing using a programmable tester to generate a driven three state signal having a data rate faster than a maximum selectable rate of test vectors. The test vectors has vector characters, each controlling a test state of a pin of a device under test. The method includes selecting a vector rate slower than a desired data rate of the driven three state signal and controlling a tester I/O device during a vector period to provide an output signal having a driven high state, a driven low state, or an inhibited state. The output signal is supplied to an input of a pull-to-center circuit adapted to provide a driven high state, a driven low state, or an output driven to a state intermediate of the driven high and the driven low states when the input of the pull-to-center circuit is supplied with an inhibited state at the input. The three state signal is utilized in testing the device under test.

DETAILED DESCRIPTION

Figure 1:
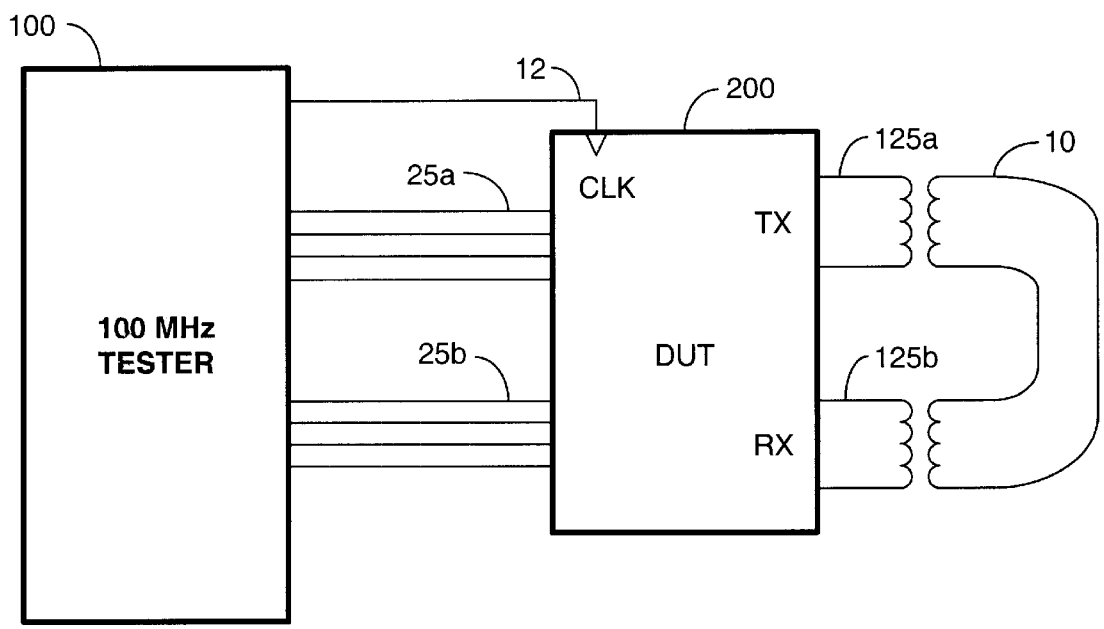
FIG. 1 shows a loop back testing method.
Figure 2:
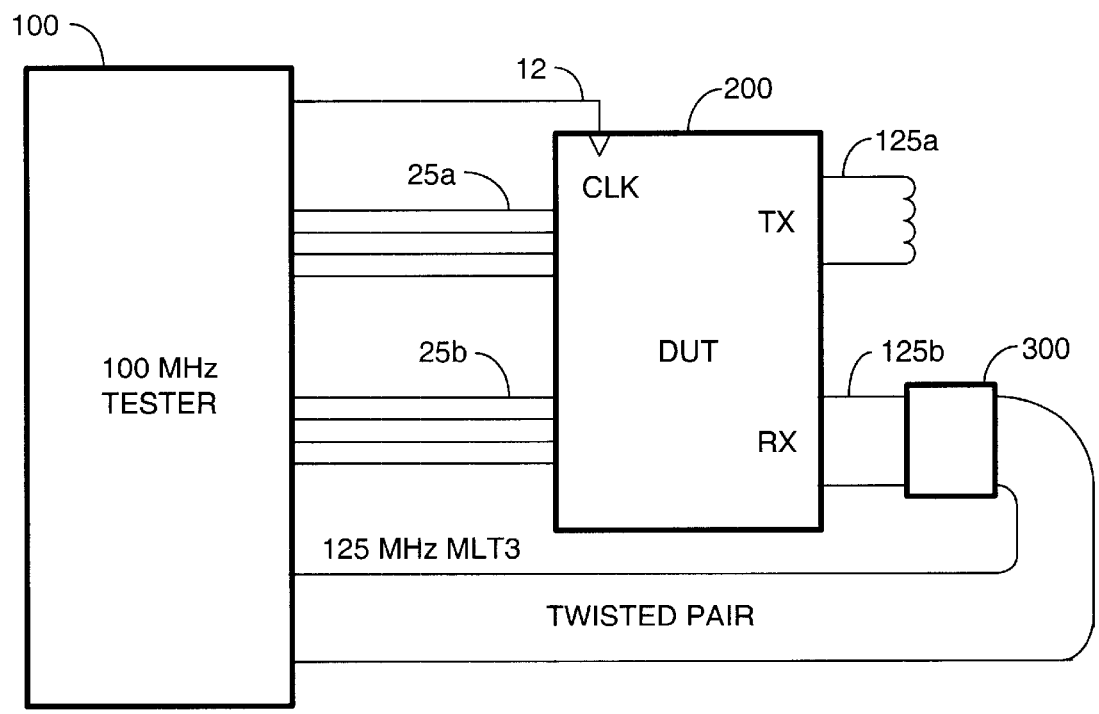
FIG. 2 shows an embodiment in accordance with a preferred method of the present invention.

Turning to FIG. 2, a programmable 100 MHz tester 100 is coupled to provide a 125 MHz signal to the twisted pair receive lines 125b of a device under test 200. In one embodiment of the present invention, a method for supplying an analog MLT3 encoded signal to the twisted pair receive pins 125b of the device under test 200 using the digital output channels of the tester 100 is provided.

A programmable automated tester 100, such as a 100 MHz Credence DUO are programmed using test vectors. The test vectors have vector characters that control the state of each pin of the tester over a specified vector time period. In the case of the 100 MHz Credence DUO, the minimum allowable vector time period is 10 nanoseconds, providing a 100 MHz test rate. As such, it is not possible to select an 8 nanosecond time period to produce the 125 MHz signal.

Nevertheless, a feature of programmable testers that allows I/O control during the vector time period may be utilized for constructing the desired 125 MHz MLT3 waveform. The test vectors may be programmed with control characters that control the I/O devices during the vector time period. Such I/O control, may be utilized to change the state of an output signal during the 10 nanosecond minimum vector time period.

The DUO tester uses a 4 bit control value for each pin in each vector. Each bit controls Force, Inhibit, Compare, and Mask or FICM functions of the I/O devices. The Force bit provides a "1" or "0" forced output. The Inhibit bit inhibits output an d thus provides a floating state at the output. The Compare bit compares an input signal to a specified value, and the Mask function masks the input of signals to the tester. 16 FICM characters are provided to reference the 16 possible combinations of the Force, Inhibit, Compare, and Mask functions.

Simply utilizing such a capability alone does not allow the desired MLT3 signal to be produced. The MLT3 encoded signal has data encoded at three levels. The digital output channels of the tester 100, however, have outputs driven to only two states. As such, the digital output of the tester does not provide the tri-state driven signal necessary for MLT3 encoding.

To provide the tri-state signal necessary for MLT3 encoding from a two state digital output, the tester 100 was programmed to provide −1 and 1 as the two state digital output. The tri-state signal was constructed from this two state signal by using an I/O device to provide the inhibited state. The inhibited state provides a third state, albeit a non-driven float state.

Figure 3:
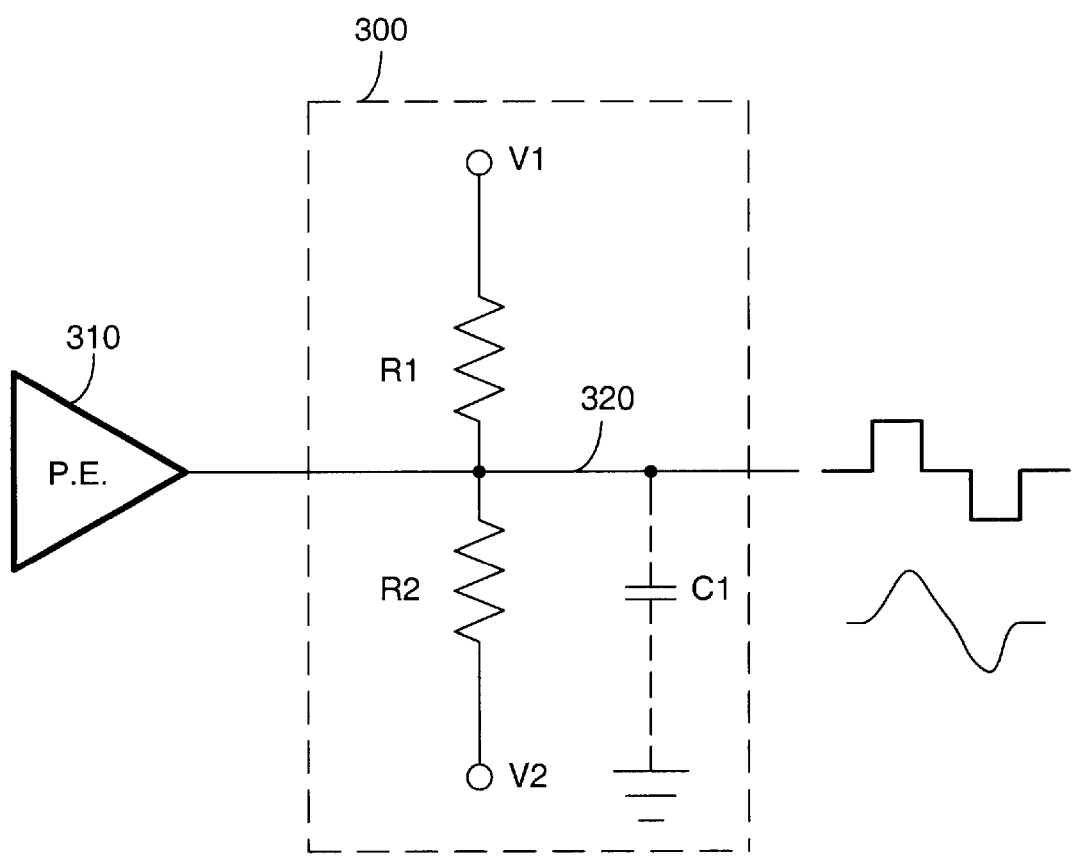
FIG. 3 shows a tester output coupled to a pull-to-center circuit in accordance with a preferred method of the present invention.

Turning to FIG. 3, to construct a tri-state driven output signal necessary to construct the MLT3 waveform, a pullto-center circuit 300 is provided as depicted in FIGS. 2 & 3. The pull-to-center circuit 300 drives the float state to a state intermediate of the driven high and the driven low states of the digital output.

In the embodiment of FIG. 3, a pin electronics I/O device 310 provides a driven high, a driven low, or a float state. A pullup resistor R1 is coupled between a positive voltage source V1 and the I/O device 310 output, while pulldown resistor R2 is coupled between a negative voltage source V2 and the I/O device 310 output.

In one embodiment, the pullup and pulldown resistors R1 and R2 are provided between voltages sources V1 and V2 having greater magnitude voltages than that of the digital two state driven voltages. The voltage level on the pullup resistor R1 is set a little higher than the voltage of the desired high state, while the pulldown resistor R2 is set a little lower than the voltage of the desired low state. In such an embodiment, the voltage sources V1 and V2 may provide voltages having 125% or more of the driven two state voltages. For example, when the tester is selected to provide +1.0 volt and −1.0 volt as the two digital output states, 100 ohm resistors R1 and R2 may be coupled to +1.25 volt and −1.25 volt sources, respectively, to drive the float state to 0 volts. Such an embodiment empirically has been determined by the present inventors to provide better response times to the driven states for constructing a 125 MHz MLT3 signal.

It is possible to use un-utilized pin electronics drivers of the tester as voltage sources V1 and V2 to supply the necessary voltages. Further, it is desirable in some embodiments to locate the resistors R1 and R2, very close to the device under test. As such, in one embodiment, the resistors R1 and R2 are located on a load board, which is proximate to the DUT.

Further, a capacitor C1, shown in phantom, may be coupled between ground and the common node of R1 and R2 to shape an analog waveform from the output of the pull-to-center circuit, if necessary. In one embodiment, a 10 picofarad capacitor is used. The precise value of the wave shaping capacitor can vary, and, in part, will be dependent on the inherent capacitance of the channel.

Although other embodiments are possible, the embodiment of FIG. 3 can provide the tri-state signal using a single digital two state channel. Such an embodiment empirically was found by the present inventors to allow lower capacitance and greater consistency under standard current loads.

Notwithstanding the enhanced capability provided by the pull-to-center circuit of FIG. 3, I/O switching capability can be limited in automated testers. Such testers often are constrained by available memory to program individual I/O control. Thus, without suitable implementation, I/O switching can prove inadequate.

The I/O devices respond to the FICM characters in accordance with a global timing set file. The global timing set is limited to ts0 through ts15 possible timing scenarios. Each vector has a single global timing set that controls the application of each of FICM character bit within that vector. Thus, the global timing set is limited to only 16 different possible timing scenarios. If the timing of only one I/O device changes with respect to the other I/O devices, a new timing scenario must be programmed. As such, testing a device under test with a large number of pins, each having different I/O timing requirements, quickly can exhaust such a limited capability.

In a preferred implementation, a 16 nanosecond time period is selected as the vector time period. The 16 nanosecond time period provides two 125 MHz MLT3 bits per test period. This selection limits the number of timing sets required to produce the 125 MHz signal.

As a result, of the possible FICM 16 characters, the ones required to reproduce the MLT3 signal are: "0" for drive low (FICM=0001), "1" for drive high (FICM=1001), "X" for float/low (FICM=0101), and "Y" for float/high (FICM=1101). "X" will force a low when not floating, and "Y" will force a high when not floating. Since the MLT3 signal is never strobed, the Mask bit is set and the Compare bit cleared.

Consequently, only three different timing scenarios were required to support MLT3 creation:

a) the entire test cycle remains driven or floated, b) the first half of the cycle is driven and the latter half is floated, and c) the first half of the test cycle is floated and the latter half is driven.

Thus, the totality of timing/vector character combinations required to produce the 125 MHz MLT3 signal is as follows:

scenario "a" with "0" to drive low for the entire test vector cycle, scenario "a" with "1" to drive high for the entire test vector cycle, scenario "a" with "X" to float for the entire test vector cycle, scenario "b" with "X" to drive low for the first half of the test vector cycle and float the last half of the cycle, scenario "b" with "Y" to drive high for the first half of the test vector cycle and float the last half of the cycle, scenario "c" with "X" to float for the first half of the test vector cycle and drive low for the last half of the cycle, and scenario "c" with "Y" to float for the first half of the test vector cycle and drive high for the last half of the cycle.

It should be noted that all three scenarios have an inhibit moment specification at either 0 or 8 nanoseconds and none at the end of the vector cycle to keep the timing edges from interfering with each other.

Therefore, the three timing sets necessary to produce a 125 MHz MLT3 signal with a 16 nanosecond vector time period can be illustrated as ts0, ts1, and ts2 as follows:

ts0 DRIVE LO AT 0 NS, DRIVE HI AT 0 NS, INHIBIT AT 0 NS, . . .

ts1 INHIBIT AT 8 NS, . . .

ts2 INHIBIT AT 0 NS, INHIBIT OFF AT 8 NS, . . .

The driven tri-state digital signal produced in this manner at the output 320 of the pull-to-center circuit 300 is supplied to the twisted pair receive pins 125*b* of the DUT 200 as an analog signal as discussed above.

In addition to the MLT3 signal, in some embodiments a 25 MHz reference clock signal also must be provided to the DUT. Because a 16 nanosecond vector test cycle was selected, the 25 MHz clock, which has a 40 nanosecond period, was not reproducible using the global timing set as discussed above. Instead, a special mode on the tester called ALT F formatting was used.

With ALT F formatting, each of the 16 timing sets available to the tester pin are controlled by the vector character instead of the global timing set for the entire vector. Thus, an ALT F character has its own timing set to control its edge moment with respect to the vector time period. By assigning 5 alternate timing sets each with a unique vector character, a 5 character sequence could be used to produce the 25 MHz clock at the 16 nanosecond vector time period. The 5 alternate timing sets could be sequenced as follows:

in cycle n+0 drive high 10 nanoseconds into test cycle,
in cycle n+1 drive low 14 nanoseconds into test cycle,
in cycle n+2 drive low 0 nanoseconds into test cycle,
in cycle n+3 drive high 2 nanoseconds into test cycle, and
in cycle n+4 drive low 6 nanoseconds into test cycle.

As such, each of the 5 characters would be assigned a timing set with one of the above timing sequence steps. For example:

| timing set | | character |
|---|---|---|
| ts0 | DRIVE HIGH AT 10 NS | R |
| ts1 | DRIVE LOW AT 14 NS | S |
| ts2 | DRIVE HIGH AT 0 NS | 2 |
| ts3 | DRIVE LOW AT 2 NS | 3 |
| ts4 | DRIVE LOW AT 6 NS | 4 |

Whenever a vector character contains one of these 5 characters, the associated I/O device is controlled in accordance with its corresponding alternate timing set. Thus, sequencing these 5 characters through successive test vectors for the same I/O device would create the 25 MHz clock signal.

Figure 4:
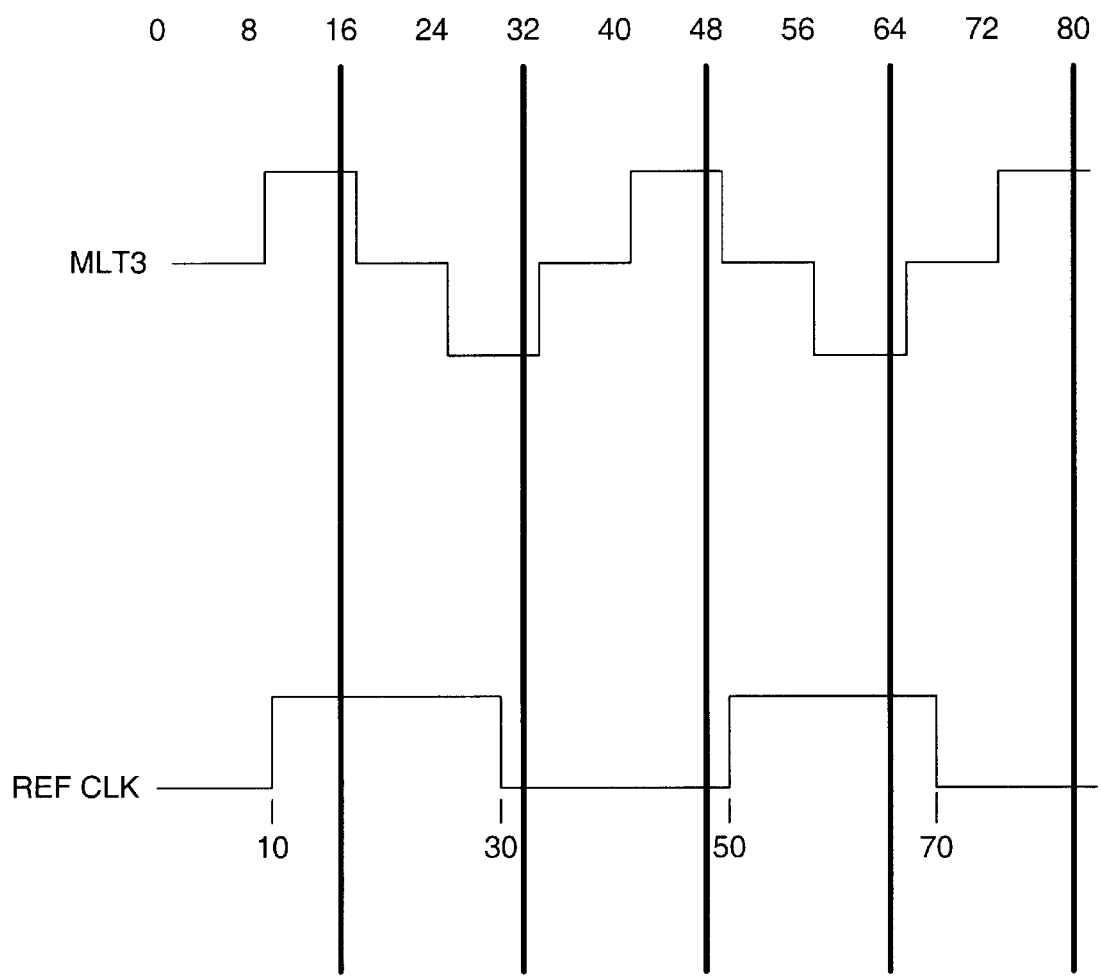
FIG. 4 shows an MLT3 signal and a 25 MHz reference clock timing diagrams.

FIG. 4 shows an MLT3 signal timing diagram and an associated 25 MHz reference clock timing diagram for the above described sequences. Because the 25 MHz reference clock has a period of 40 nanoseconds, two cycles of the 25 MHz clock occur every 5 vectors periods. FIG. 4 depicts the idle state transitions of an MLT3 signal without encoded data. It is possible to generate the 25 MHz clock with other appropriate timing sequences, such as, for example:

| timing set | | character |
|---|---|---|
| ts0 | DRIVE HIGH AT 0 NS | R |
| ts1 | DRIVE LOW AT 4 NS | S |
| ts2 | DRIVE HIGH AT 8 NS | 2 |
| ts3 | DRIVE LOW AT 12 NS | 3 |
| ts4 | DRIVE LOW AT 0 NS | 4 |

Such an alternate timing sequence would produce a 25 MHz signal (not shown) shifted with respect to the illustrated MLT3 sequence of FIG. 4.

The test vectors were manipulated with an "AWK" script to insert the appropriate vector character to the clock pin, and to each one of the MLT3 twisted pair receive pins, and to create unique cycle times for the MLT3 signals.

Generating MLT3 signals with the tester rather than using a loop back allowed the tester to verify the tracking of the phase lock loop of the receiver circuitry of the DUT. The pins on the Credence DUO tester are divided into quadrants containing 128 pins each. Each quadrant can run at a different rate. Two MLT3 signals, one for each of the twisted pair receive pins, were assigned to tester pins in the second quadrant (pins 129–256) and given cycle time selects different than the uniform 25 MHz test cycles of the first quadrant. By programming the second quadrant cycle time select used throughout the first half of a pattern loop to a cycle time a bit faster than the first quadrant, and the second half of the pattern loop to a cycle time a bit slower than the first quadrant, the MLT3 signal is in synchronism at the loop ends but most divergent, phase wise, midway through the loop. As such, each half of the test loop can supply the MLT3 receive pins with a different fixed frequency determined by the difference between the nominal and actual cycle times. As such, this can be used to verify the tracking capability of the receive phase lock loop of the DUT.

In one implementation, one of 16 programmable cycle timing selects cy0–cy15, such as cy0, may be programmed with a vector time period or cycle time of 16 nanoseconds. The cy0 cycle timing select is applied to each vector of the first quadrant. Second and third timing selects, such as cy1 and cy2, may be programmed with vector time periods or cycle times of 16+t nanoseconds and 16−t nanoseconds, respectively, and assigned to the MLT3 twisted pair receive pins assigned to the second quadrant. In one configuration, cy1 is programmed at 16.0625 nanoseconds, while cy2 is programmed at 15.9375 nanoseconds. The cy1 cycle timing select is assigned to the second quadrant for the first half of the test loop, while cy2 cycle timing select is assigned to the second quadrant pins for the second half of the test loop. The cy1 and cy2 cycle time selects may be assigned to every vector of the respective portion of the test loop, or to selected vectors. As such, in one implementation, the cy1 cycle timing select is applied to every $8^{th}$ vector of the first half of the test loop, while the cy2 cycle timing set is applied to every $8^{th}$ vector of the second half of the test loop.

The above implementation, allows the DUT to be tested utilizing only two quadrants. This allows testers having only two quadrants to provide such test capabilities. Further, it can extend the capabilities of a tester with more than two quadrants by allowing the additional quadrants to be utilized for additional testing, such as to provide dual site testing.

While the preferred methods and embodiments of the present invention have been described in detail above, many changes to these embodiments may be made without departing from the true scope and teachings of the present invention. The present invention, therefore, is limited only as claimed below and the equivalents thereof.

What we claim is:

1. A method for generating a signal for testing in a programmable tester comprising:
    a) selecting a two state digital output channel;
    b) controlling an I/O device for the two state digital channel during vector periods using control characters responsive to global timing sets to provide a signal comprising a driven high state, a driven low state, and an inhibited state; and
    c) generating from the signal provided by the I/O device a signal comprising a driven high state, a driven low state, and a driven intermediate state using a pull-to-center circuit.

2. The method of claim 1 wherein controlling the I/O device further comprising programming a first global timing set to drive or float for an entire vector period, a second global timing set to drive a first portion of the vector period and to float a latter portion of the vector period, and a third global timing set to float a first portion of the vector period and to drive a latter portion of the vector period.

3. The method of claim 2 wherein programming the second global timing set comprises programming the second global timing set to drive a first half of the vector period and to float a latter half of the vector time period, and wherein programming the third global timing set comprises programming the third global timing set to float a first half of the vector period and to drive a latter half of the vector period.

4. The method of claim 3 wherein generating the signal with high, low, and intermediate driven states comprises generating an analog signal.

5. The method of claim 1 further comprising selecting a vector rate slower than a desired data rate.

6. The method of claim 5 further comprising selecting a vector rate having one half the desired data rate.

7. The method of claim 6 wherein generating the signal with high, low, and intermediate driven states comprises generating an analog signal.

8. The method of claim 1 further comprising:
a) selecting a second channel; and
b) controlling an I/O device for the second channel during the vector period using control characters responsive to alternate timing sets.

9. The method of claim 8 wherein controlling the I/O device responsive to the global timing set comprises providing a signal having a data rate other than a vector rate corresponding to the vector period, and wherein controlling the second channel I/O device responsive to the alternate timing sets comprises providing a signal having a data rate other than the vector rate.

10. The method of claim 9 further comprising selecting a vector period of 16 nanoseconds, and wherein controlling I/O responsive to the global timing set comprises providing a signal at a 125 MHz rate, and wherein controlling the second channel I/O device responsive to the alternate timing sets comprises providing a signal at a 25 MHz rate.

11. The method of claim 1 wherein using the pull-to-center circuit comprises supplying the output signal to a node comprising a pull-up resistor coupled between the node and a power source providing about 125% of the driven high state and a pull-down resistor coupled between the node and a power source providing about 125% of the driven low state.

12. The method of claim 11 wherein generating the signal with high, low, and intermediate driven states comprises utilizing a pull-to-center circuit comprising a capacitor.

13. The method of claim 12 wherein generating the signal with high, low, and intermediate driven states comprises generating an analog signal.

14. The method of claim 1 further comprising:
a) selecting a tester pin in a first quadrant to provide the driven three state signal to the device under test; and
b) selecting tester pins in a second quadrant to provide selected other signals to the device under test; and
c) varying vector periods for vector characters associated with the first quadrant with respect to vector periods for vector characters associated with the second quadrant so as to be capable of providing the driven three state signal with a varied rate with respect to the selected other signals.

15. The method of claim 1 wherein generating the signal with high, low, and intermediate driven states comprises generating an analog signal.

16. The method of claim 1 wherein generating further comprises varying time periods of vector characters controlling the three state signal over a test loop while selecting constant vector time periods for selected other signals.

17. A method for testing using a programmable tester comprising:
a) generating a driven three state signal having a data rate faster than a maximum selectable rate of test vectors, a test vector comprising vector characters, each vector character controlling a test state of a pin of a device under test, wherein generating the driven three state signal comprises:
(i) selecting a vector rate slower than a desired data rate of the driven three state signal;
(ii) controlling a tester I/O device during a vector period to provide an output signal having a driven high state, a driven low state, or an inhibited state; and
(iii) supplying the I/O device output signal to an input of a pull-to-center circuit adapted to provide a driven high state in response to the I/O driven high state, a driven low state in response to the I/O driven low state, and an output driven to a state intermediate of the driven high and the driven low states when the input of the pull-to-center circuit is supplied with the I/O provided inhibited state; and
b) supplying the driven three state signal to the device under test.

18. The method of claim 17 wherein generating the driven three state signal comprises generating an analog signal.

19. The method of claim 18 further comprising:
a) generating at least one additional signal having a transition rate at other than the data rate of the three state signal and the test vector test rate comprising:
(i) controlling tester I/O devices using global timing set, a global timing set being associated with each vector and controlling the tester I/O devices during the vector test period; and
(ii) defining control characters responsive to an alternate timing set, the alternate timing set controlling a corresponding I/O device during each vector period independent of the global timing set;
(iii) controlling a selected tester I/O device using the control characters in the test vector to generate the second signal; and
b) supplying the at least one other signal to the device under test.

20. The method of claim 17 wherein generating the at least one additional signal comprises generating a 25 MHz clock signal.

21. The method of claim 17 wherein selecting the vector rate comprises selecting a 16 nanosecond period, and wherein the desired data rate of the driven three state signal 125 MHz, and wherein defining control characters and controlling a selected I/O device comprises defining control character to generate a 25 MHz clock signal.

22. The method of claim 17 further comprising:
a) providing the driven three state signal to the device under test using a tester pin in a first quadrant; and
b) providing the at least one other signal to the device under test using a tester pin in a second quadrant; and
c) varying vector time periods for vector characters associated with the first quadrant with respect to vector time periods for vector characters associated with the second quadrant so as to provide the driven three state signal with a varied rate with respect to the at least one other signal.

23. The method of claim 18 wherein selecting the vector rate comprises selected a rate that is one half the desired data rate of the driven three state signal.

24. The method of claim 23 wherein selecting the vector rate comprises selecting a 16 nanosecond period and wherein the desired data rate of the driven three state signal is 125 MHz.

25. The method of claim 18 wherein supplying the I/O output signal to the input of a pull-to-center circuit comprises supplying the I/O output signal to the input of a pull-to-center circuit adapted to generate the analog state signal.

26. The method of claim 18 wherein the supplying the I/O output signal to the input of the pull-to-center circuit comprises supplying the I/O output signal to a node comprising a pull-up resistor coupled to a power source providing about 125% of the driven high state and pull-down resistor coupled to a power source providing about 125% of the driven low state.

27. The method of claim 18 wherein generating the driven three state signal comprises programming a test loop comprising vectors, and further comprising varying time periods of a vector characters corresponding to the three state signal over the test loop while providing constant vector periods to vector characters corresponding to selected other signals.

28. The method of claim 18 further comprising:
   a) providing the driven three state signal to the device under test using a tester pin in a first quadrant; and
   b) providing the selected other signals to the device under test using tester pins in a second quadrant; and
   c) varying vector periods for vector characters associated with the first quadrant with respect to vector periods for vector characters associated with the second quadrant so as to provide the driven three state signal with a varied rate with respect to the selected other signals.

29. The method of claim 17 wherein the supplying the output signal to the input of the pull-to-center circuit comprises supplying the output signal to a node comprising about a 100 ohm pull-up resistor coupled between the node and a power source providing about +1¼ volts, about a 100 ohm pull-down resistor coupled between the node and a power source providing about −1¼ volts, and about a 10 picofarad capacitor coupled between the node and ground.

30. A programmable tester comprising;
   a) a processor capable of implementing stored vectors to control generation of a signal in a test channel;
   b) a storage medium for storing vectors, the vectors comprising vector characters for controlling I/O devices of test channels and comprising a vector rate, the stored vectors comprising a vector rate slower than a desired data rate of an output test signal;
   c) a test channel comprising an I/O device capable of being controlled during vector periods to provide an I/O signal having a driven high state, a driven low state, and an inhibited state; and
   d) a pull-to-center circuit coupled to the I/O device and capable of providing a three state driven signal comprising a driven high state in response to the I/O driven high state, a driven low state in response to the I/O driven low state, and an output driven to a state intermediate of the driven high and low states provided by the pull-to-center circuit when the pull-to-center circuit is supplied with the I/O inhibited state.

31. The programmable tester of claim 30 wherein the pull-to-center circuit comprises: a pull-up resistor coupled between a positive voltage source and a node, a pull-down resistor coupled between a negative voltage source and the node, and a wave shaping capacitor coupled between the node and ground.

32. The programmable tester of claim 31 comprising at least one additional test channel programmed to generate at least one additional signal having a transition rate at other than the data rate of the three state driven signal and the vector rate, the stored vector comprising global timing sets for controlling the tester I/O devices and comprising alternate timing sets associated with control characters capable of controlling corresponding I/O devices for the at least one additional test channel during each vector period independent of the global timing set.

33. The programmable tester of claim 32 wherein the vector rate comprises a 16 nanosecond period, and wherein the desired data rate is 125 MHz, and wherein the control characters associated with the alternate timing set are capable of generating a 25 MHz signal.

34. The programmable tester of claim 32 wherein the tester comprises first and second quadrants of output pins, and wherein the stored vectors provide a vector rate for the first quadrant which varies with respect to a vector rate of the second quadrant, and wherein the vector rate of one of the first and second quadrants is constant.

* * * * *